(12) United States Patent
Wang et al.

(10) Patent No.: US 11,508,939 B2
(45) Date of Patent: Nov. 22, 2022

(54) ARRAY SUBSTRATE HAVING RESONANT CAVITY FORMED BY REFLECTIVE LAYER AND CATHODE, MANUFACTURING METHOD THEREOF AND DISPLAY DEVICE

(71) Applicant: BOE TECHNOLOGY GROUP CO., LTD., Beijing (CN)

(72) Inventors: Guoying Wang, Beijing (CN); Zhen Song, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 97 days.

(21) Appl. No.: 17/047,750

(22) PCT Filed: Dec. 23, 2019

(86) PCT No.: PCT/CN2019/127344
§ 371 (c)(1),
(2) Date: Oct. 15, 2020

(87) PCT Pub. No.: WO2020/143436
PCT Pub. Date: Jul. 16, 2020

(65) Prior Publication Data
US 2021/0167332 A1    Jun. 3, 2021

(30) Foreign Application Priority Data

Jan. 11, 2019   (CN) .......................... 201910028201.5

(51) Int. Cl.
*H01L 51/52*    (2006.01)
*H01L 27/32*    (2006.01)
*H01L 51/56*    (2006.01)

(52) U.S. Cl.
CPC ...... *H01L 51/5265* (2013.01); *H01L 27/3244* (2013.01); *H01L 51/56* (2013.01); *H01L 2227/323* (2013.01)

(58) Field of Classification Search
CPC .. H01L 51/5265; H01L 27/3244; H01L 51/56
See application file for complete search history.

(56) References Cited

U.S. PATENT DOCUMENTS

2008/0018243 A1 *   1/2008   Ishiguro .............. H01L 51/5271
                                                             313/506
2013/0140535 A1     6/2013   Chu et al.
(Continued)

FOREIGN PATENT DOCUMENTS

CN    101989646 A    3/2011
CN    102184937 A    9/2011
(Continued)

OTHER PUBLICATIONS

China Patent Office, First Office Action dated Jun. 23, 2020 for application No. CN201910028201.5.

*Primary Examiner* — Michael Jung
(74) *Attorney, Agent, or Firm* — Houtteman Law LLC

(57) ABSTRACT

The disclosure provides an array substrate, a manufacturing method of the array substrate and a display device. The array substrate provided by the embodiment of the present disclosure includes sub-pixel units with multiple light-emitting colors; each sub-pixel unit includes a resonant cavity formed by a reflective layer and a cathode which are oppositely arranged, and the resonant cavity further includes: an anode positioned between the reflective layer and the cathode, and a light-emitting function layer positioned between the anode and the cathode; lengths of resonant cavities of the sub-pixel units with a same one of the light-emitting colors are the same, and lengths of resonant cavities of the sub-pixel units with different light-emitting colors are different; thicknesses
(Continued)

of anodes of the sub-pixel units with different light-emitting colors are the same, thicknesses of light-emitting function layers of the sub-pixel units with different light-emitting colors are the same.

10 Claims, 2 Drawing Sheets

(56) References Cited

U.S. PATENT DOCUMENTS

2015/0137082 A1* 5/2015 Kim .................... H01L 51/5265
257/40
2016/0218154 A1 7/2016 Pyo et al.
2018/0240854 A1 8/2018 Nozawa et al.

FOREIGN PATENT DOCUMENTS

| CN | 102610630 A | 7/2012 |
| CN | 104091894 A | 10/2014 |
| CN | 104409468 A | 3/2015 |
| CN | 105720081 A | 6/2016 |
| CN | 108461643 A | 8/2018 |
| CN | 108470844 A | 8/2018 |
| CN | 109659349 A | 4/2019 |

* cited by examiner

ARRAY SUBSTRATE HAVING RESONANT CAVITY FORMED BY REFLECTIVE LAYER AND CATHODE, MANUFACTURING METHOD THEREOF AND DISPLAY DEVICE

CROSS-REFERENCE TO RELATED APPLICATIONS

The present application is a U.S. National Stage Application under 35 U.S.C. § 371 of International Patent Application PCT/CN2019/127344, filed on Dec. 23, 2019, which claims priority to China Patent Application No. 201910028201.5 filed on Jan. 11, 2019, the disclosure of both which are incorporated by reference herein in entirety.

TECHNICAL FIELD

The present disclosure relates to the field of display technology, and in particular to an array substrate and a manufacturing method thereof, and a display device.

BACKGROUND

Organic Light-Emitting diodes (OLEDs) are widely used in the field of display and the like because of their advantages of self-luminescence, high efficiency, low operating voltage, light weight and thinness, flexibility, and the like.

SUMMARY

Embodiments of the present disclosure provide an array substrate, a manufacturing method thereof and a display device, which are used for improving a display effect of a display product and improving a manufacturing yield of resonant cavities.

An embodiment of the present disclosure provides an array substrate, including sub-pixel units with a plurality of light-emitting colors; each of the sub-pixel units includes a resonant cavity formed by a reflective layer and a cathode which are opposite to each other, and the resonant cavity further includes: an anode positioned between the reflective layer and the cathode, and a light-emitting function layer positioned between the anode and the cathode;
lengths of resonant cavities of the sub-pixel units with a same one of the light-emitting colors are the same, and lengths of resonant cavities of the sub-pixel units with different light-emitting colors are different; thicknesses of anodes of the sub-pixel units with different light-emitting colors are the same, and thicknesses of light-emitting function layers of the sub-pixel units with different light-emitting colors are the same.

According to the array substrate provided by the embodiment of the present disclosure, the thicknesses of the anodes of the sub-pixel units with different light-emitting colors are the same, and the thicknesses of the light-emitting function layers of the sub-pixel units with different light-emitting colors are the same, namely, in the array substrate provided by the embodiment of the present disclosure, and in the sub-pixel units with different light-emitting colors, different from the light-emitting function layers and the anodes, film layers of the resonant cavities have different thicknesses, so that different thicknesses of the resonant cavities of the sub-pixel units with different light-emitting colors can be realized. In this way, since there is no need to provide the anodes with different thickness, there will be no problem of residues or over-etching during etching for the anodes and the yield of the resonate cavities will not be affected.

Besides, since the film layers of the resonant cavities other than the light-emitting function layers and the anodes in the sub-pixel units with different light-emitting colors have different thicknesses, a diversity of cavity lengths of the resonant cavities can be realized, and a full-color display effect of a display product is improved.

In some implementations, the resonant cavity further includes an insulating layer between the reflective layer and the anode.

According to the array substrate provided by the embodiment of the present disclosure, since the insulating layer is arranged between the reflective layer and the anode, a work function of the anode cannot be pulled down by the reflective layer, a voltage for turning on the OLED can be reduced, and power consumption of the display product can be reduced. Moreover, the insulating layer is arranged between the reflective layer and the anode, and thus a surface roughness of the anode can be improved, and a service life of device is prolonged.

In some implementations, thicknesses of reflective layers of the sub-pixel units with different light-emitting colors are different and/or thicknesses of insulating layers of the sub-pixel units with different light-emitting colors are different.

In some implementations, the array substrate further includes a thin film transistor, the reflective layer is provided as a whole layer and has a via hole exposing a drain of the thin film transistor, and the anode is electrically coupled to the drain of the thin film transistor through the via hole.

According to the array substrate provided by the embodiment of the present disclosure, since the reflective layer is arranged as a whole layer, and the via hole is only formed in a coupling area between the anode and the drain, light blocking effect of the reflective layer on the TFT array can be improved, and operation reliability of the TFT array is improved.

In some implementations, the reflective layer is made of metal.

In some implementations, the anode is made of indium tin oxide.

An embodiment of the present disclosure provides a manufacturing method of an array substrate, including:
forming sub-pixel units of a plurality of light-emitting colors on a base; each of the sub-pixel units includes a resonant cavity formed by a reflective layer and a cathode disposed opposite to each other, the resonant cavity further including: an anode positioned between the reflective layer and the cathode, and a light emitting function layer positioned between the anode and the cathode; lengths of resonant cavities of the sub-pixel units with a same one of the light-emitting colors are the same, and lengths of resonant cavities of the sub-pixel units with different light-emitting colors are different; thicknesses of anodes of the sub-pixel units with different light-emitting colors are the same, and thicknesses of light-emitting function layers of the sub-pixel units with different light-emitting colors are the same.

In some implementations, the forming the sub-pixel units of the plurality of light-emitting colors on the base further includes:
forming the reflective layer, an insulating layer, the anode, the light-emitting function layer and the cathode on the base in sequence;
thicknesses of reflective layers of the sub-pixel units with different light-emitting colors are different, and/or thicknesses of insulating layers of the sub-pixel units with different light-emitting colors are different.

In some implementations, the base includes a thin film transistor pixel circuit, and the forming the reflective layer, the insulating layer, the anode, the light-emitting function layer and the cathode on the base in sequence includes:

forming a metal reflective layer on the thin film transistor pixel circuit, where the metal reflective layer is provided with a via hole exposing a drain of the thin film transistor;

forming the insulating layer on the metal reflective layer, where the insulating layer is provided with a via hole exposing the drain of the thin film transistor;

processing the insulating layer by adopting a dry etching process to ensure that thicknesses of insulating layers of the sub-pixel units with different light-emitting colors are different;

forming the anode on the insulating layer, where the anode is electrically coupled to the drain of the thin film transistor through the via hole in the insulating layer and the via hole in the metal reflective layer; and sequentially forming the light-emitting function layer and the cathode on the anode.

An embodiment of the present disclosure provides a display device, including the array substrate in the above embodiment.

DESCRIPTION OF DRAWINGS

In order to more clearly illustrate technical solutions of embodiments of the present disclosure, drawings required to be used in the description of the embodiments are briefly introduced below, and it is obvious that the drawings in the following description are only some embodiments of the present disclosure, and it is obvious for those skilled in the art to obtain other drawings without any creative effort based on these drawings.

DESCRIPTION OF EMBODIMENTS

An emission band of a general organic light-emitting material is relatively wide, and a full width at half maximum of spectrum is about 100 nanometers, there still exist a certain difference to realize a saturated color required by a full-color display. In order to improve a full-color display effect, a method of introducing an optical resonant cavity into a device has been proved to be an excellent method. Compared with a common organic light-emitting device, the organic light-emitting device with the resonant cavity can obtain light emission with better monochromaticity, realize narrow-band emission, enhance emission intensity and select emission wavelength. A material of an anode of the organic light-emitting device with the resonant cavity in the related art needs to contain a metal with a relatively high reflectivity, and a reflective anode is usually in a three-layer stack structure, such as Indium Tin Oxide (ITO)/silver (Ag)/ITO, or the like. In order to make cavity lengths of resonant cavities of sub-pixels with different colors be different, ITO layers with different thicknesses are respectively arranged on reflective metals of the sub-pixels with different colors in the related art. It is difficult to form the ITO layer with a relative thickness, and thus cavity length diversity of the resonant cavities is limited, and improvement of the full-color display effect is limited. In addition, in the process of etching to form ITO layers with different thicknesses, a problem of residues or over-etching is easy to occur during etching ITO, and a yield of the resonant cavities is influenced. In summary, the solution for forming the resonant cavities with different cavity lengths limits the improvement of the full-color display effect and affects the manufacturing yield of the resonant cavities.

Figure 1:
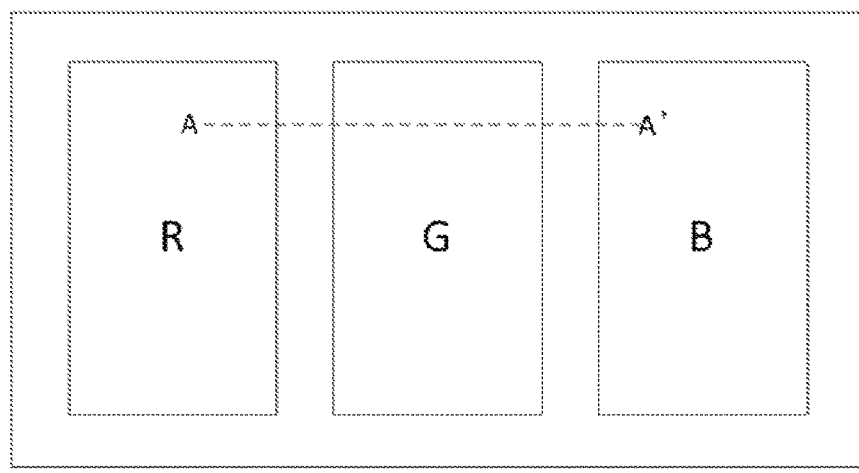
FIG. 1 is a schematic view of an array substrate according to an embodiment of the present disclosure.
Figure 2:
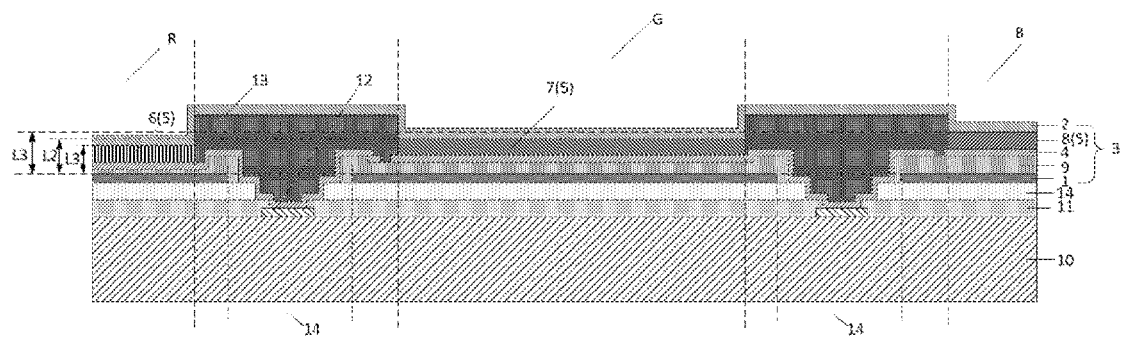
FIG. 2 is a schematic cross-sectional view of the array substrate of FIG. 1 along line AA' in an embodiment of the present disclosure.

An embodiment of the present disclosure provides an array substrate, as shown in FIG. 1, the array substrate has sub-pixel units with multiple light-emitting colors; a cross-sectional view along line AA' in FIG. 1 is shown in FIG. 2, each of the sub-pixel units includes a resonant cavity 3 formed by a reflective layer 1 and a cathode 2 disposed opposite to each other, and the resonant cavity 3 further includes: an anode 4 positioned between the reflective layer 1 and the cathode 2, and a light-emitting function layer 5 positioned between the anode 4 and the cathode 2; as shown in FIGS. 1 and 2, the array substrate includes a red sub-pixel unit R, a green sub-pixel unit G and a blue sub-pixel unit B, and in FIG. 2, the light-emitting function layer 5 includes a red light-emitting function layer 6, a green light-emitting function layer 7 and a blue light-emitting function layer 8.

Lengths of the resonant cavities 3 of the sub-pixel units with a same one of the light-emitting colors are the same, and lengths of the resonant cavities 3 of the sub-pixel units with different light-emitting colors are different; thicknesses of anodes 4 of the sub-pixel units with different light-emitting colors are the same, and thicknesses of light-emitting function layer 5 of the sub-pixel units with different light-emitting colors are the same.

According to the array substrate provided by the embodiment of the present disclosure, the thicknesses of the anodes of the sub-pixel units with different light-emitting colors are the same, and the thicknesses of the light-emitting function layers of the sub-pixel units with different light-emitting colors are the same, namely, in the array substrate provided by the embodiment of the present disclosure, and in the sub-pixel units with different light-emitting colors, different from the light-emitting function layers and the anodes, film layers of the resonant cavities have different thicknesses, so that different thicknesses of the resonant cavities of the sub-pixel units with different light-emitting colors can be realized. In this way, since there is no need to provide the anodes with different thickness, there will be no problem of residues during etching for the anodes and the yield of the resonate cavities will not be affected. Besides, the film layers of the resonant cavities other than the light-emitting function layers and the anodes in the sub-pixel units with different light-emitting colors have different thicknesses, so that a diversity of cavity lengths of the resonant cavities can be realized, and the full-color display effect of a display product is improved.

In FIG. 1, illustration will be made by taking the array substrate including a red sub-pixel unit R, a green sub-pixel unit G, and a blue sub-pixel unit B as an example, but the array substrate may also include sub-pixel units of other light-emitting colors.

In some implementations, in the array substrate shown in FIG. 2 provided by the embodiment of the present disclosure, the resonant cavity 3 further includes an insulating layer 9 located between the reflective layer 1 and the anode 4.

The array substrate provided by the embodiment of the present disclosure is an OLED substrate, and since the insulating layer 9 is arranged between the reflective layer and the anode, a work function of the anode cannot be pulled down by the reflective layer, a voltage for turning on the OLED can be reduced, and power consumption of the display product can be reduced. Moreover, the insulating layer is arranged between the reflective layer and the anode, and thus a surface roughness of the anode can be improved, and a service life of device is prolonged.

In some implementations, thicknesses of reflective layers of the sub-pixel units with different light-emitting colors are different and/or thicknesses of insulating layers of the sub-pixel units with different light-emitting colors are different.

In the array substrate shown in FIG. 2 provided by the embodiment of the present disclosure, the thicknesses of the reflective layers 1 of the sub-pixel units with different light-emitting colors are the same, the thicknesses of the insulating layers 9 of the sub-pixel units with different light-emitting colors are different, the thickness of the insulating layer 9 in the red sub-pixel unit R is smaller than the thickness of the insulating layer 9 in the green sub-pixel unit G, and the thickness of the insulating layer 9 in the green sub-pixel unit G is smaller than the thickness of the insulating layer 9 in the blue sub-pixel unit B, so that the length L1 of the resonant cavity in the red sub-pixel unit R is smaller than the length L2 of the resonant cavity in the green sub-pixel unit G, and the length L2 of the resonant cavity in the green sub-pixel unit G is smaller than the length L3 of the resonant cavity in the blue sub-pixel unit B, thereby realizing the different lengths of the resonant cavities of the sub-pixel units with different light-emitting colors.

Figure 3:
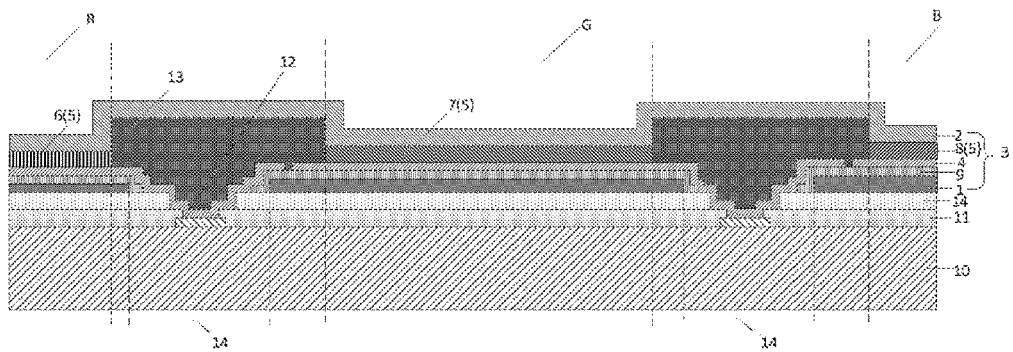
FIG. 3 is a schematic view of another array substrate in an embodiment of the present disclosure.
Figure 4:
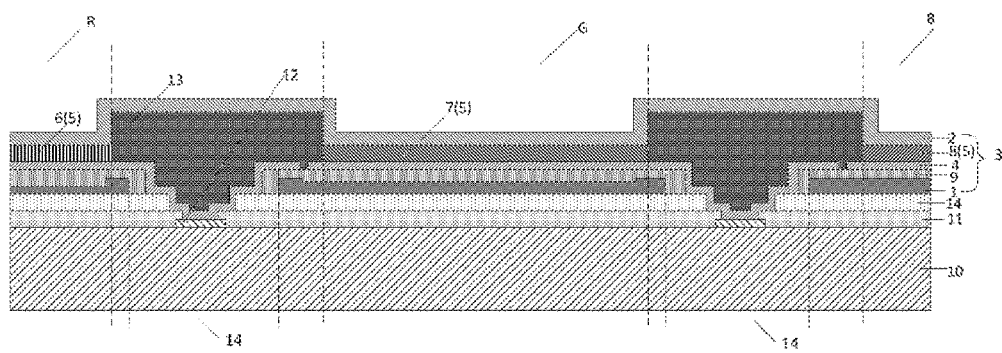
FIG. 4 is a schematic view of further another array substrate in an embodiment of the present disclosure.

FIG. 2 illustrates that the thicknesses of the insulating layers of the sub-pixel units with different light-emitting colors are different, certainly, as shown in FIG. 3, the thicknesses of the reflective layers of the sub-pixel units with different light-emitting colors are different, or as shown in FIG. 4, the thicknesses of the insulating layers 9 of the sub-pixel units with different light-emitting colors are different, and the thicknesses of the reflective layers of the sub-pixel units with different light-emitting colors are also different, and in such way, the lengths of the resonant cavities of the sub-pixel units with different light-emitting colors can also be different.

In some implementations, the array substrate provided in the embodiment of the present disclosure and shown in FIGS. 2 to 4 further includes a thin film transistor (TFT), the reflective layer 1 is disposed as a whole layer and has a via hole 14 exposing a drain 12 of the thin film transistor, and the anode is electrically coupled to the drain of the thin film transistor through the via hole.

In the array substrate provided by the embodiment of the present disclosure, since the reflective layer is arranged as a whole layer, and the via hole is only formed in a coupling area between the anode and the drain, light blocking effect of the reflective layer on the TFT array can be improved, and operation reliability of the TFT array is improved.

In the array substrate, shown in FIGS. 2 to 4, provided by the embodiment of the present disclosure, a base 10 includes other film layers of the thin film transistor (not shown). The array substrate further includes: a protective layer 11 (PVX) having via holes on the base 10, a planarization layer 14 having via holes on the protective layer 11, and a pixel defining layer 13 (PDL) defining the sub-pixel units.

In some implementations, a material of the reflective layer is metal. For example, the metal may be silver.

In some implementations, a material of the anode is indium tin oxide (ITO).

An embodiment of the present disclosure provides a manufacturing method of an array substrate, which includes the following steps:

forming sub-pixel units of a plurality of light-emitting colors on a base, each of the sub-pixel units includes a resonant cavity formed by a reflective layer and a cathode disposed opposite to each other, the resonant cavity further including: an anode positioned between the reflective layer and the cathode, and a light emitting function layer positioned between the anode and the cathode; lengths of resonant cavities of the sub-pixel units with a same one of the light-emitting colors are the same, and lengths of resonant cavities of the sub-pixel units with different light-emitting colors are different; thicknesses of anodes of the sub-pixel units with different light-emitting colors are the same, and thicknesses of light-emitting function layers of the sub-pixel units with different light-emitting colors are the same.

In some implementations, the forming the sub-pixel units of the plurality of light-emitting colors on the base specifically includes:

forming the reflective layer, an insulating layer, the anode, the light-emitting function layer and the cathode on the base in sequence;

thicknesses of reflective layers of the sub-pixel units with different light-emitting colors are different, and/or thicknesses of insulating layers of the sub-pixel units with different light-emitting colors are different.

In some implementations, the base includes a thin film transistor pixel circuit, and the forming the reflective layer, the insulating layer, the anode, the light-emitting function layer and the cathode on the base in sequence specifically includes:

forming a metal reflective layer on the thin film transistor pixel circuit, where the metal reflective layer is provided with a via hole exposing a drain of the thin film transistor;

forming the insulating layer on the metal reflective layer, where the insulating layer is provided with a via hole exposing the drain of the thin film transistor;

processing the insulating layer by adopting a dry etching process to ensure that the thicknesses of the insulating layers of the sub-pixel units with different light-emitting colors are different;

forming the anode on the insulating layer, where the anode is electrically coupled with the drain of the thin film transistor through the via hole in the insulating layer and the via hole in the metal reflective layer;

sequentially forming the light-emitting function layer and the cathode on the anode.

According to the manufacturing method of the array substrate, the insulating layers of the sub-pixel units with different light-emitting colors are etched to different degrees by adopting the dry etching process, so that the problem of residues or over-etching caused by etching ITO (indium tin oxide) can be solved, and the manufacturing yield is improved.

In some implementations, the base includes a thin film transistor pixel circuit, and the forming the reflective layer, the insulating layer, the anode, the light-emitting function layer, and the cathode on the base in sequence specifically includes:

forming a metal reflective layer on the thin film transistor pixel circuit, and etching the metal reflective layer corresponding to the sub-pixel units with different light-emitting colors to different degrees to ensure that thicknesses of the metal reflective layer corresponding to the sub-pixel units with different light-emitting colors are different, where the metal reflective layer is provided with a via hole exposing a drain of the thin film transistor;

forming a planarized insulating layer on the metal reflective layer, the insulating layer is provided with a via hole exposing the drain of the thin film transistor;

forming the anode on the insulating layer, where the anode is electrically coupled to the drain of the thin film transistor through the via hole in the insulating layer and the via hole in the metal reflective layer;

sequentially forming the light-emitting function layer and the cathode on the anode.

In the manufacturing method of the array substrate provided by the embodiment of the present disclosure, the metal reflective layer corresponding to the sub-pixel units of different light-emitting colors is etched to different degrees, and a wet etching process may be adopted, compared with etching ITO, due to difference in material, a metal material is easily to be formed as a thick layer, and it is easier to etch metal material than to etch ITO, for example, an over-etching time in a metal etching process is shorter than that in an ITO etching process, the etching yield is high, consequently, by etching the metal reflective layer corresponding to the sub-pixel units of different light-emitting colors to different degrees, manufacturing yield of the resonant cavities cannot be influenced, and a diversity of cavity lengths can be realized and the effect of full-color display of a display product is improved.

Figure 5:
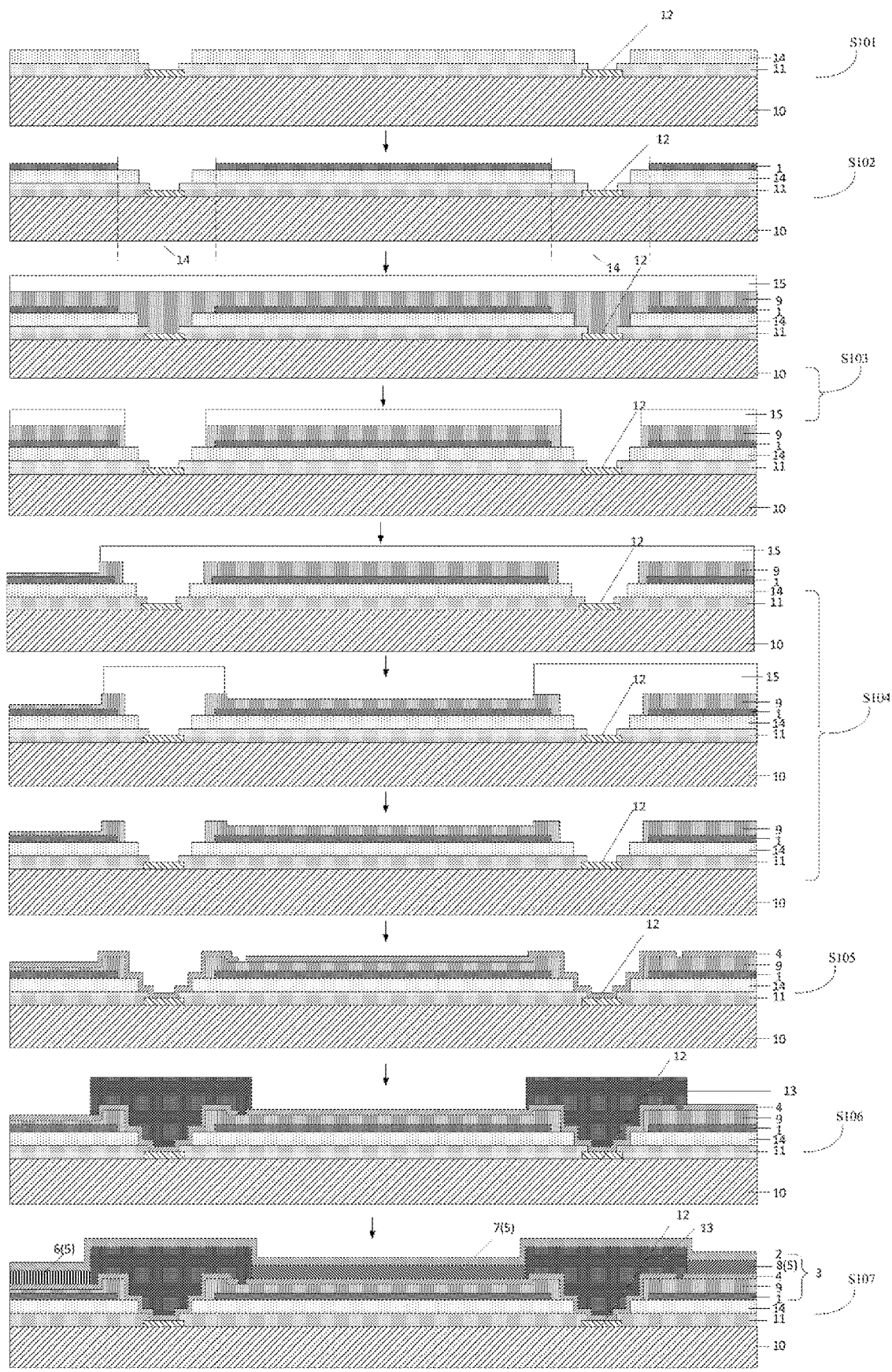
FIG. 5 is a schematic view illustrating a manufacturing method of an array substrate according to an embodiment of the present disclosure.

Next, taking the example that the thicknesses of the insulating layers of the sub-pixel units with different light-emitting colors are different, the manufacturing method of the array substrate provided in the embodiment of the present disclosure is illustrated, and as shown in FIG. 5, the manufacturing method includes steps S101 to S107.

At step S101, a thin film transistor array, a protective layer 11 with a via hole and exposing a drain 12 of a thin film transistor, and a planarization layer 14 are formed on a base.

Forming the thin film transistor array may include, for example, a step of forming a buffer layer (Buffer), an active layer, a gate insulating layer (GI), a gate, an interlayer insulating layer (ILD), a source and a drain on the base, the base 10 includes a substrate base, the Buffer, and other film layers of the thin film transistor, which are not shown.

At step S102, a reflective layer 1 is formed as a whole layer, and a patterning process is performed on the reflective layer 1 to form a via hole 14 exposing the drain of the thin film transistor.

At step S103, an insulating layer 9 is formed on the reflective layer 1; a patterning process is performed on the insulating layer 9 to form a via hole exposing the drain 12.

The patterning process performed on the insulating layer to form the via hole exposing the drain 12 specifically includes:

coating a photoresist 15 on the insulating layer 9;

exposing and developing the photoresist 15, and etching the insulating layer 9 to form the via hole; and removing the photoresist 15;

where the insulating layer may include, for example, aluminum oxide, or an inorganic insulating material such as silicon nitride or silicon oxide; the aluminum oxide may be formed over the reflective layer by a sputtering process, and the inorganic insulating material may be deposited by PECVD.

At step S104, insulating layers 9 of the sub-pixel units with different colors are etched by adopting dry etching to ensure that thicknesses of the insulating layers 9 of the sub-pixel units with different light-emitting colors are different.

Etching the insulating layers 9 of the sub-pixel units with different colors by adopting dry etching specifically includes the following steps:

coating a photoresist 15, and for each of the sub-pixel units with different colors, respectively exposing and developing the photoresist 15 and etching the insulating layer 9; and removing the photoresist 15.

At step S105, sputtering is performed to form a single layer of ITO and a patterning process is performed on the layer of ITO to form the anode 4, where the ITO is coupled to the drain of the thin film transistor through the via hole.

At step S106, a material of a pixel defining layer 13 is coated, and a patterning process is performed on the pixel defining layer 13 to define light emitting areas of the sub-pixels.

At step S107, a light emitting function layer 5 is formed in each of the sub-pixel units with different light-emitting colors, and a cathode 2 is formed on the light emitting function layer 5.

The thin film transistor may be in, for example, a top gate structure, a Back Channel Etch (BCE) structure, an Etch Stop Layer (ESL) structure, or the like. A material of the active layer may be, for example, an oxide, a silicon material, or an organic material, and specifically, the material of the active layer may include, for example, amorphous Indium Gallium Zinc Oxide material (a-IGZO), Zinc oxynitride (ZnON), IZTO, amorphous silicon (a-Si), low temperature polysilicon (p-Si), hexathiophene, polythiophene, and the like. Materials of electrodes and leads of the thin film transistor may be metal materials commonly used, such as silver (Ag), copper (Cu), aluminum (Al), molybdenum (Mo), and the like, or alloy materials of the above metals, such as aluminum neodymium alloy (AlNd), molybdenum niobium alloy (MoNb), and the like, or multilayer metals, such as MoNb/Cu/MoNb, and the like, or may be stack structures of metals and transparent conductive oxides, such as Indium Tin Oxide (ITO), aluminum-doped zinc oxide (AZO), and the like, such as Mo/AlNd/ITO, ITO/Ag/ITO, and the like. Materials of the Buffer, GI, ILD, PVX layers include dielectric materials such as silicon oxide (SiOx), silicon nitride (SiNx), silicon oxynitride (SiON), or various novel organic insulating materials, or high dielectric constant materials such as aluminum oxide (AlOx), hafnium oxide (HfOx), tantalum oxide (TaOx), and the like. A material of the planarization layer having a planarization effect may be, for example, a polysiloxane series material, an acrylic material, a polyimide material and any other material with planarization effect. A material of the PDL may be, for example, photoresist (PR).

An embodiment of the disclosure provides a display device, which includes the array substrate provided by the embodiment of the present disclosure.

To sum up, according to the array substrate and the manufacturing method thereof, and the display device provided by the embodiments of the present disclosure, the thicknesses of the anodes of the sub-pixel units with different light-emitting colors are the same, and the thicknesses of the light-emitting function layers of the sub-pixel units with different light-emitting colors are the same, namely, in the array substrate provided by the embodiment of the present disclosure, and in the sub-pixel units with different light-emitting colors, different from the light-emitting function layers and the anodes, film layers of the resonant cavities have different thicknesses, so that different thicknesses of resonant cavities of the sub-pixel units with different light-emitting colors can be realized. In this way, since there is no need to provide the anodes with different thickness, there will be no problem of residues during etching for the anodes and the yield of the resonate cavities will not be affected. Besides, the film layers of the resonant cavities other than the light-emitting function layers and the anodes in the sub-pixel units with different light-emitting colors have different thicknesses, so that the diversity of cavity lengths of the resonant cavities can be realized, and the full-color display effect of the display product is improved.

It will be apparent to those skilled in the art that various changes and modifications may be made in the present disclosure without departing from the spirit and scope of the present disclosure. Thus, if such changes and modifications of the present disclosure fall within the scope of claims of the present disclosure and their equivalents, the present disclosure is intended to include such changes and modifications as well.

What is claimed is:

1. An array substrate, comprising sub-pixel units with a plurality of light-emitting colors; each of the sub-pixel units comprises a resonant cavity formed by a reflective layer and a cathode which are opposite to each other, and the resonant cavity further comprises: an anode positioned between the reflective layer and the cathode, and a light-emitting function layer positioned between the anode and the cathode; lengths of resonant cavities of the sub-pixel units with a same one of the light-emitting colors are the same, and lengths of resonant cavities of the sub-pixel units with different light-emitting colors are different; thicknesses of anodes of the sub-pixel units with different light-emitting colors are the same, and thicknesses of light-emitting function layers of the sub-pixel units with different light-emitting colors are the same, wherein
the resonant cavity further comprises an insulating layer between the reflective layer and the anode, and
thicknesses of reflective layers of the sub-pixel units with different light-emitting colors are different and/or thicknesses of insulating layers of the sub-pixel units with different light-emitting colors are different.

2. The array substrate of claim 1, further comprising a thin film transistor, the reflective layer is provided as a whole layer and has a via hole exposing a drain of the thin film transistor, and the anode is electrically coupled to the drain of the thin film transistor through the via hole.

3. The array substrate of claim 1, wherein the reflective layer is made of metal.

4. The array substrate of claim 1, wherein the anode is made of indium tin oxide.

5. A display device, comprising the array substrate of claim 1.

6. A display device, comprising the array substrate of claim 2.

7. A display device, comprising the array substrate of claim 3.

8. A display device, comprising the array substrate of claim 4.

9. A manufacturing method of an array substrate, comprising:
forming sub-pixel units of a plurality of light-emitting colors on a abase; wherein each of the sub-pixel units comprises a resonant cavity formed by a reflective layer and a cathode disposed opposite to each other, the resonant cavity further comprising: an anode positioned between the reflective layer and the cathode, and a light emitting function layer positioned between the anode and the cathode; lengths of resonant cavities of the sub-pixel units with a same one of the light-emitting colors are the same, and lengths of resonant cavities of the sub-pixel units with different light-emitting colors are different; thicknesses of anodes of the sub-pixel units with different light-emitting colors are the same, and thicknesses of light-emitting function layers of the sub-pixel units with different light-emitting colors are the same, wherein
the forming the sub-pixel units of the plurality of light-emitting colors on the base further comprises:
forming the reflective layer, an insulating layer, the anode, the light-emitting function layer and the cathode on the base in sequence; wherein
thicknesses of reflective layers of the sub-pixel units with different light-emitting colors are different, and/or thicknesses of insulating layers of the sub-pixel units with different light-emitting colors are different.

10. The manufacturing method of claim 9, wherein the base comprises a thin film transistor pixel circuit, and the forming the reflective layer, the insulating layer, the anode, the light-emitting function layer and the cathode on the base in sequence comprises:
forming a metal reflective layer on the thin film transistor pixel circuit, wherein the metal reflective layer is provided with a via hole exposing the drain of the thin film transistor;
forming the insulating layer on the metal reflective layer, wherein the insulating layer is provided with a via hole exposing the drain of the thin film transistor;
processing the insulating layer by adopting a dry etching process to ensure that the thicknesses of the insulating layers of the sub-pixel units with different light-emitting colors are different;
forming the anode on the insulating layer, wherein the anode is electrically coupled to the drain of the thin film transistor through the via hole in the insulating layer and the via hole in the metal reflective layer; and
sequentially forming the light-emitting function layer and the cathode on the anode.

* * * * *